United States Patent
Hu et al.

(10) Patent No.: US 10,256,606 B2
(45) Date of Patent: Apr. 9, 2019

(54) WAVELENGTH-TUNABLE EXTERNAL-CAVITY LASER AND ADJUSTABLE LIGHT EMISSION MODULE

(71) Applicant: Accelink Technologies Co., Ltd., Wuhan (CN)

(72) Inventors: Shenglei Hu, Wuhan (CN); Yanfeng Fu, Wuhan (CN); Yi Tang, Wuhan (CN); Di Zhang, Wuhan (CN); Shiyu Li, Wuhan (CN); Xuesheng Tang, Wuhan (CN); Kun Qian, Wuhan (CN); Weidong Ma, Wuhan (CN); Qianggao Hu, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 15/740,655

(22) PCT Filed: Dec. 15, 2015

(86) PCT No.: PCT/CN2015/097441
§ 371 (c)(1),
(2) Date: Dec. 28, 2017

(87) PCT Pub. No.: WO2017/000511
PCT Pub. Date: Jan. 5, 2017

(65) Prior Publication Data
US 2018/0191132 A1    Jul. 5, 2018

(30) Foreign Application Priority Data

Jun. 29, 2015  (CN) .......................... 2015 1 0369052

(51) Int. Cl.
*H01S 5/06*    (2006.01)
*H01S 5/14*    (2006.01)
(Continued)

(52) U.S. Cl.
CPC ................. *H01S 5/06* (2013.01); *H01S 5/14* (2013.01); *H01S 5/142* (2013.01); *H01S 5/50* (2013.01);
(Continued)

(58) Field of Classification Search
CPC ................. H01S 5/06; H01S 5/14; H01S 5/50
See application file for complete search history.

(56) References Cited

U.S. PATENT DOCUMENTS

2003/0219045 A1*  11/2003  Orenstein ........... H01S 5/06255
372/20

FOREIGN PATENT DOCUMENTS

CN    102868090 A    1/2013
CN    203164550 U    8/2013
(Continued)

OTHER PUBLICATIONS

Chinese Search Report for Application No. CN2015103690520 dated Aug. 1, 2017.
International Search Report for Application No. PCT/CN2015/097441 dated Mar. 24, 2016.

*Primary Examiner* — Dung Nguyen
(74) *Attorney, Agent, or Firm* — Lerner, David, Littenberg, Krumholz & Mentlik, LLP

(57) ABSTRACT

A wavelength-tunable external cavity laser comprises a semiconductor optical amplifier chip and a laser external cavity, the laser external cavity comprising a grid filter, a phase adjustor and a silicon-based micro-ring chip, the grid filter and the silicon-based micro-ring chip constituting a wavelength-tunable optical filter which implements wavelength tuning by spectral tuning of the grid filter and/or the silicon-based micro-ring chip. A micro-ring filter in the silicon-based micro-ring chip of the tunable external-cavity laser is manufactured by adopting a mature silicon light technology, which can greatly reduce a manufacturing dif- (Continued)

ficulty of the adjustable filter, and reduce the manufacturing cost of a device. An existing external-cavity adjustable technology platform may be used for smooth transition, so as to improve the degree of integration of this type of device and simplify a preparation process.

13 Claims, 3 Drawing Sheets

(51) Int. Cl.
*H01S 5/50* (2006.01)
*H01S 3/106* (2006.01)
*H01S 5/00* (2006.01)
*H01S 5/024* (2006.01)

(52) U.S. Cl.
CPC ........... *H01S 3/1062* (2013.01); *H01S 5/0064* (2013.01); *H01S 5/02446* (2013.01)

(56) References Cited

FOREIGN PATENT DOCUMENTS

| | | | |
|---|---|---|---|
| CN | 103633547 | * | 3/2014 |
| CN | 103904555 A | | 7/2014 |
| CN | 203849456 U | | 9/2014 |
| CN | 204129369 U | | 1/2015 |
| CN | 104483543 A | | 4/2015 |
| CN | 104966989 A | | 10/2015 |

* cited by examiner

WAVELENGTH-TUNABLE EXTERNAL-CAVITY LASER AND ADJUSTABLE LIGHT EMISSION MODULE

CROSS REFERENCE TO RELATED APPLICATIONS

The present application is a national phase entry under 35 U.S.C. § 371 of International Application No. PCT/CN2015/097441, filed Dec. 15, 2015, which claims priority from Chinese Patent Application No. 201510369052.0 filed Jun. 29, 2015, all of which are hereby incorporated herein by reference.

TECHNICAL FIELD

The present invention relates to a laser emitting device and, more particularly, to a method of implementing a wavelength-tunable external-cavity laser and an adjustable light emission module. Specifically, the present invention relates to a hybrid integrated adjustable external-cavity laser based on silicon-based waveguide micro-ring. The laser may be used in multi-wavelength optical communication network and coherent-light communication system.

BACKGROUND

An adjustable external-cavity laser has characteristics such as narrow spectral line width (less than 100 kHz), excellent side-mode suppression ratio (more than 45 dB), wide wavelength tunable range (more than 40 nm) and so on, and accordingly, it has been widely used as a light source at the transmitting end and as a local oscillator laser at the receiving end in the coherent wavelength-division optical communication system of 100 Gbit/s or above.

In addition, in the access network service using the technologies of wavelength-division multiplexing passive optical network (WDM-PON) and hybrid time and wavelength division multiplexing passive optical network (TWDM-PON), the multi-wavelength tunable optical transmitting module is also used.

As requirements for module size and power consumption become higher and higher, optical modules adopting an integration or hybrid integration scheme attract more attention because they can effectively reduce the power consumption and miniaturize the device and module size while ensuring the emission performance. Especially in recent years, the silicon-based optoelectronic chip technology has drawn unprecedented attention in the field of optical communication because it is compatible with the CMOS process, and it has gradually shifted from the laboratory to commercial application. As silicon has an indirect band-gap, it is very difficult to make silicon itself generate laser. Therefore, if the silicon-based optoelectronic technology is used to make a laser, a hybrid integration approach using a III-V semiconductor gain chip and a silicon-based chip is often adopted.

The Chinese Patent Application Publication No. CN103904555A discloses a tunable laser and a method of implementing the tunable laser applicable to a TWDM-PON system. A FP (Fabry-Perot) laser outputs a multi-longitudinal-mode laser signal, which enters a micro-ring filter. The micro-ring filter has a resonant frequency adjusted to match the multi-longitudinal-mode of the FP, and the optical signal of the selected longitudinal-mode is divided into two signals, one of which is input into the FP laser for injection locking mode-lock, and the other is used as an optical output signal. However, the wavelength of the optical output signal of this kind of laser is determined by the free spectral range of the FP laser, and it is difficult to accurately align to the wavelength channel value specified by the ITU-T. In addition, the multi-FP cavity effect generated by adopting the injection locking scheme also has a problematic stability of the optical power.

SUMMARY

An object of the present invention is to achieve, by a structure as simple as possible, a tunable laser technology which has not only a multi-channel tuning function with a wide wavelength range, but also a narrow line-width and a low intensity and phase noise like a single channel optical signal.

The object of the present invention is achieved as follows:
1. A semiconductor optical amplifier chip provides a broadband gain, and amplifies a longitudinal-mode preferably fed back from an external cavity. Depending on the application, a stable single longitudinal-mode optical signal output may be selectively provided on the other side of the chip.
2. An adjustable filter including a grid filter and a micro-ring filter provides, by the vernier effect, a selective feedback of an external-cavity longitudinal-mode corresponding to a desired wavelength.
3. An adjustable phase element is added to the optical path to achieve precise wavelength alignment and to implement the wavelength locking function.
4. The micro-ring filter achieves the die to silicon-based chip waveguide spot match by lens coupling, so as to ensure a low loss from the free space light to the waveguide transmission.
5. The MZI of the silicon-based chip may provide a modulated optical signal output at one end, which achieves integration of the laser and the modulator.

The present invention provides a wavelength-tunable external-cavity laser comprising a semiconductor optical amplifier chip and a laser external cavity comprising a grid filter, a phase adjuster and a silicon-based micro-ring chip, the grid filter and the silicon-based micro-ring chip constituting a wavelength-tunable light filter, and wavelength tuning of the light filter being achieved by spectral tuning of the grid filter and/or the silicon-based micro-ring chip.

In the above technical solution, when current is injected, the semiconductor optical amplifier chip generates stimulated emission. A light extraction end face of the semiconductor optical amplifier chip is plated with an AR film, and the other end is plated with a HR film. A gain region of the semiconductor optical amplifier chip is a semiconductor gain amplifier of a inclined straight waveguide or an arc waveguide.

In the above technical solution, the semiconductor optical amplifier chip is a laser die both ends of which are plated with a reflective film.

In the above technical solution, the grid filter is a fixed grid filter or an adjustable grid filter.

In the above technical solution, the silicon-based micro-ring chip and the phase adjustor are coupled by a first lens, and the semiconductor optical amplifier chip and the grid filter are coupled by a second lens.

In the above technical solution, the free spectral range (FSR) of the grid filter is 25 GHz, 50 GHz or other channels spacing frequency of DWDM.

In the above technical solution, the phase adjustor is an optical element to change the optical path by thermal adjustment and/or electric adjustment.

In the above technical solution, the grid filter is a Fabry-Perot grid filter, which is a silicon etalon with temperature sensing and a regional heating metal film for forming a fixed grid periodical spectrum.

In the above technical solution, the silicon-based micro-ring chip comprises a beam-splitting coupler and a micro-ring annular waveguide. The beam-splitting coupler has a common end as a coupling inlet and a resonant light outlet, and the beam-splitting coupler has two splitting ports connected to two ports at a side of the micro-ring annular waveguide. Each of the two ports of the micro-ring annular waveguide is used as an in end and also a drop end with respect to the other port.

In the above technical solution, the micro-ring annular waveguide may be provided with a structure to control the free carrier concentration, which may tune the resonance peak of the micro-ring annular waveguide by the plasma dispersion effect of silicon; and/or, a thermal thin-film resistor may be arranged around the micro-ring annular waveguide, which may tune the resonance peak of the micro-ring annular waveguide by changing its temperature.

In the above technical solution, the silicon-based micro-ring chip comprises a first beam-splitting coupler, a micro-ring annular waveguide, a second beam-splitting coupler, and a silicon-based MZI modulator; the generated laser enters the micro-ring annular waveguide from the first beam-splitting coupler and then is output from both through ends of the micro-ring annular waveguide. The two optical signals may be combined in the second beam-splitting coupler and then enter the MZI modulator, which outputs a modulated optical signal at a back end thereof.

In the above technical solution, the micro-ring annular waveguide and the MZI modulator are provided with a structure to control the free carrier concentration, which implements tuning of the resonant peak of the micro-ring annular waveguide and the intensity modulation of the MZI modulator by the plasma dispersion effect of silicon; and/or, a thermal thin-film resistor may be arranged around the micro-ring annular waveguide and the MZI modulator, which implement tuning of the resonance peak of the micro-ring annular waveguide and tuning of the bias operation point of the MZI modulator by changing the temperature of the micro-ring annular waveguide and the MZI modulator, respectively.

The present invention has the following advantages and positive effects:

① As compared with other free space optical schemes, the external-cavity tunable laser with the hybrid integrated silicon-based micro-ring has the same excellent output characteristics and tuning range characteristics, and it is also easy to integrate other functions. The present invention may expand the application range of the external-cavity tunable laser.

② By realizing the tunable function with the micro-ring filter, the external-cavity tunable laser of the present invention may be fabricated by directly updating the traditional external-cavity laser manufacturing process.

③ The core elements such as the micro-ring filter and the modulator may be manufactured by the traditional integrated circuit CMOS process, which has advantages such as low cost, high yield and easy to make batch production.

④ The waveguide device made by the silicon-base process has a small size and low tuning power consumption, and is beneficial to manufacture of miniaturized optical modules. It has a broad application prospect.

REFERENCE SIGNS

1—silicon-based micro-ring chip
2—micro-ring annular waveguide
3—thermal resistor
4—1×2 beam-splitting coupler
5—lens
6—phase adjustor
7—Fabry-Perot grid filter
8—external-cavity coupling lens
9—semiconductor optical amplifier chip
10—output lens
11—optical isolator
12—photodetector
13—splitter
14—collimator
15—1×2 beam-splitting coupler
16—MZI modulator

DESCRIPTION OF EMBODIMENTS

Hereinafter, a further description will be given with reference to drawings and embodiments.

Figure 3:
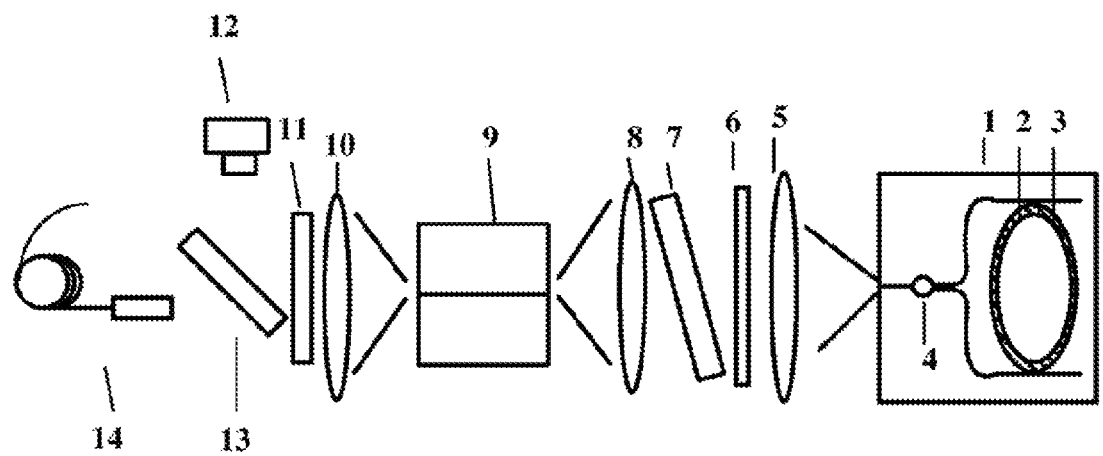
FIG. 3 shows an embodiment of a silicon-based external-cavity tunable laser according to the present invention.

FIG. 3 shows an embodiment of a silicon-based external-cavity tunable laser including a semiconductor optical amplifier chip 9 which generates stimulated emission when current is injected, and an external cavity of the laser constituted by a Fabry-Perot grid filter 7, a phase adjustor 6 and a silicon-based micro-ring chip 1. The left end faces of the silicon-based micro-ring chip 1 and the semiconductor optical amplifier chip 9 are two feedback end faces of the laser.

The light extraction end face of the semiconductor optical amplifier chip 9 is plated with an AR film, and the other end is plated with a HR film. The gain region of the semiconductor optical amplifier chip 9 is a semiconductor gain amplifier of an inclined straight waveguide or an arc waveguide.

The phase adjustor 6 is an optical element to change the optical path by thermal adjustment and/or electric adjustment.

The optical isolator 11 may prevents the output end face on the optical path from reflecting light. The splitter 13, the photodetector 12 and the collimator 14 constitute a coupling output part of the silicon-based external-cavity tunable laser.

A lens 5 is provided between the silicon-based micro-ring chip 1 and the phase adjustor 6, and an external-cavity coupling lens 8 and an output lens 10 are provided at both ends of the semiconductor optical amplifier chip 9, respectively, for optical path coupling and alignment. The light emitted from the right end face of the semiconductor optical amplifier chip 9 is collimated by the external-cavity coupling lens 8 and then passes through the Fabry-Perot grid filter 7, the phase adjustor 6 in this order, and then is focused and coupled into the silicon-based micro-ring chip 1 by the lens 5. The light is reflected by the micro-ring annular waveguide 2 of the silicon-based micro-ring chip 1 and returns to the semiconductor optical amplifier chip 9 along the incoming path, and the feedback light is reflected again by the left end face of the semiconductor optical amplifier, thereby forming multi-longitudinal-mode oscillation of the laser. The Fabry-Perot grid filter 7 and the silicon-based micro-ring chip 1 together select a mode for laser emission, and the emitted light is output from the left end face of the semiconductor optical amplifier chip 9.

The Fabry-Perot grid filter 7 is a silicon etalon with temperature sensing and a regional heating metal film, particularly, an assembly made up of a silicon plate fabricated by optical cold processing and a ceramic plate with a heating metal film, for forming a fixed grid periodical spectrum. Temperature sensing and the heating metal film may implement feedback control on the temperature of the silicon etalon, and thereby the filtering spectrum of the Fabry-Perot grid filter 7 may be finely adjusted by temperature so as to make the resonance peak align to a wavelength value specified by the ITU-T.

The silicon-based micro-ring chip 1 is a waveguide structure that integrates a beam-splitting coupler 4, a micro-ring annular waveguide 2 and a thermal resistor 3. The beam-splitting coupler 4 has a common end serving as a coupling inlet and a resonant light outlet, and two splitting ports connected to two ports at a side of the micro-ring annular waveguide 2, respectively. Each of the two ports of the micro-ring annular waveguide 2 is used as an in end and also a drop end with respect to the other port. The micro-ring annular waveguide 2 functions as a micro-ring filter, and the 1×2 beam-splitting coupler 4 functions to make the incoming light of the micro-ring annular waveguide 2 form a loop with the drop end and form a feedback of the silicon-based external-cavity tunable laser.

The silicon-based micro-ring annular waveguide 2 in the silicon-based micro-ring chip 1 is provided with a structure to control the free carrier concentration, which may implement controllable electric tuning of the resonance peak of the micro-ring annular waveguide 2 by the plasma dispersion effect of silicon, which is called as electric tuning. Around the micro-ring annular waveguide 2 may be further provided a heating temperature control device, i.e., a heating resistor 3. The resonant peak may also be shifted by temperature change of the micro-ring annular waveguide 2 induced by the heating resistor 3, which is called as thermal tuning. For the two ways of tuning the periodical spectrum of the silicon-based micro-ring microchip 1 as discussed above, the electric tuning has a quick response but a small tuning range, so it is used for fine tuning. The thermal tuning has a relatively slow response but a wide tuning range, so it is used for coarse tuning.

Figure 1:
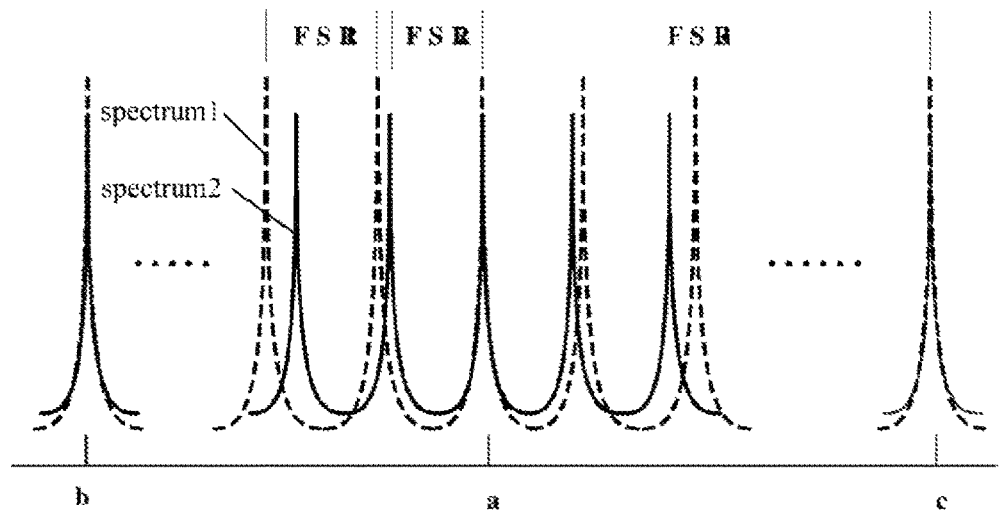
FIG. 1 is a schematic diagram showing spectra of a micro-ring filter and a grid filter according to the present invention.

In the external-cavity, the Fabry-Perot grid filter 7 and the silicon-based micro-ring chip 1 constitute and implement a wavelength-tunable optical filter. As shown in FIG. 1, the silicon-based micro-ring chip 1 generates a periodical spectrum represented by the spectrum 1 shown as a dotted line in FIG. 1 with a free spectral range FSR1, and the grid filter generates a periodical filtering spectrum represented by the spectrum 2 shown as a solid line in FIG. 1 with a free spectral range FSR2. It is assumed in FIG. 1 that the two spectra coincide with each other at a position a, and positions b and c are the positions where the spectra coincide again. Assuming a distance between the position a and the position b and a distance between the position a and the position c each is FSR3, FSR3, FSR2 and FSR1 satisfy the following relationship:

$$INT(FSR3)=(FSR1*FSR2)/ABS(FSR2-FSR1).$$

When any one of the two spectra is fixed and the other is tuned, grid alignment may be achieved for a fixed filter. When the two spectra are tuned synchronously, the synthetic filtering spectrum may be wholly shifted. The Fabry-Perot grid filter 7 and the silicon-based micro-ring chip 1 may be tuned according to any of the above tuning manners depending on different applications. By means of the spectral tuning of the Fabry-Perot grid filter 7 and the silicon-based micro-ring chip 1, the wavelength tuning of the optical filter made up by the Fabry-Perot grid filter 7 and the silicon-based micro-ring chip 1 may be implemented.

In the embodiment, FSR1 may be 50.45 Ghz, and a diameter of the micro-ring annular waveguide 2 may be selected according to FSR1.

Figure 2:
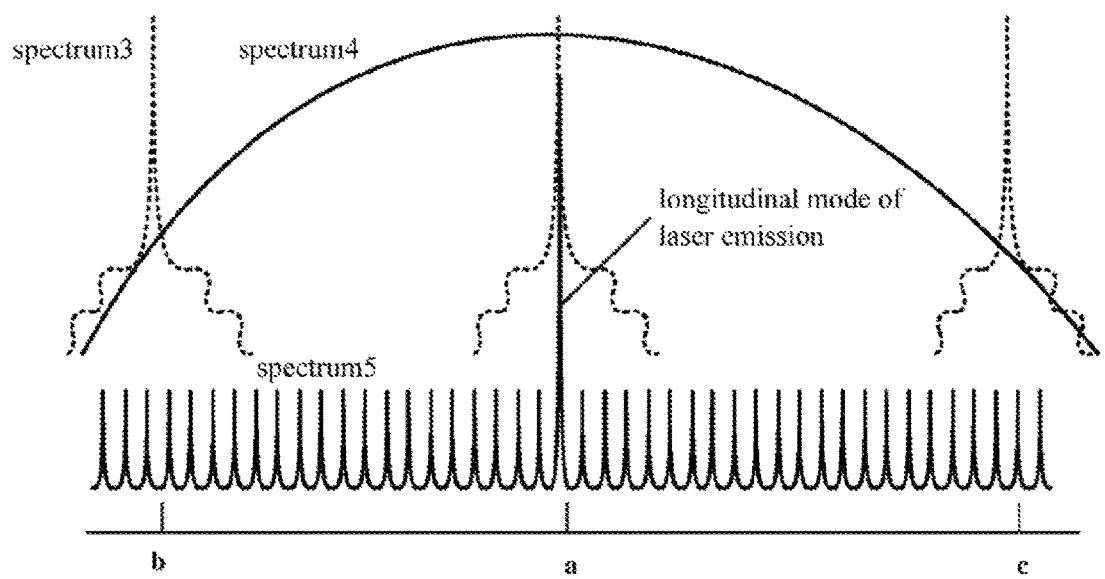
FIG. 2 is a schematic diagram showing principle of mode selection of the filter constituted by the micro-ring filter and the grid filter according to the present invention.

FIG. 2 is a schematic diagram showing principle of external cavity mode selection in the tunable filter of the above discussed implementation, in which the spectrum 3 is a synthetic spectrum of the optical filter composed of the grid filter 7 and the silicon-based micro-ring chip 1 in FIG. 1, the spectrum 4 is the gain spectrum of the semiconductor optical amplifier chip 9, and the spectrum 5 is the standing-wave spectrum of the external cavity. The optical filter has a relatively large free spectral range, the gain corresponding to the position b and the position c is relatively small, and only the longitudinal-mode at the position a may obtain a relatively large gain and form a laser output. The synthetic filtering spectrum of the optical filter made up by the grid filter 7 and the silicon-based micro-ring chip 1 may be tuned so that a longitudinal mode at other positions may be selected to form the laser emission, thereby implementing wavelength tuning of the laser.

Figure 4:
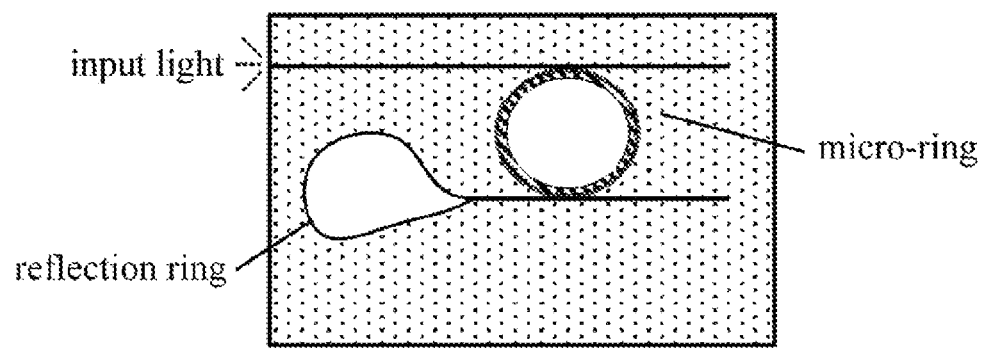
FIG. 4 is a schematic diagram showing an optical path of a tunable transmitting module integrated with an external modulator according to the present invention.

FIG. 4 shows a silicon-based micro-ring chip according to another embodiment, which may be used to replace the silicon-based micro-ring chip 1 in FIG. 3. In the silicon-based micro-ring chip of FIG. 4, the drop end of the micro-ring is used to implement spectrum filtering, and it constitutes a feedback loop together with a reflection ring. If the reflection ring in this structure is designed to have a tuning function, it may replace the phase adjustor 6 in the external cavity and achieve a function of freely adjusting the cavity length of the external cavity.

Figure 5:
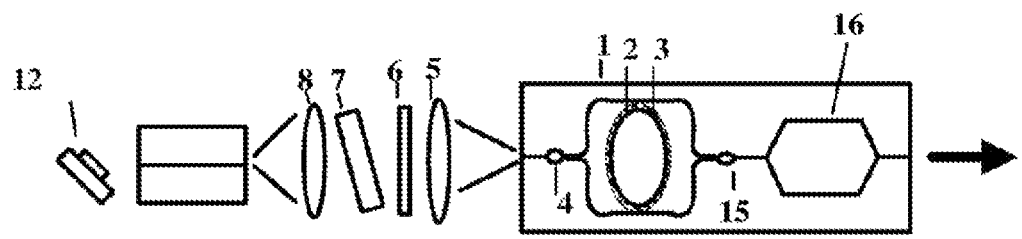
FIG. 5 shows another embodiment of a silicon-based external-cavity tunable laser according to the present invention.

FIG. 5 shows another embodiment of the present invention in which the external cavity of the tunable laser has a design exactly the same as that in FIG. 3, and the difference is that the micro-ring annular waveguide 2 and a MZI modulator 16 are integrated in the silicon-based micro-ring chip. The laser generated in the external cavity enters the micro-ring annular waveguide 2 from the 1×2 beam-splitting coupler 4 and is then output from both through ends of the micro-ring annular waveguide 2. The two optical signals are combined in the 1×2 beam-splitting coupler 15 and then the combined signal enters into the MZI modulator 16. A modulated optical signal may be output at the back end of the MZI modulator 16. The photodetector 12 may be placed on the left side of the semiconductor optical amplifier die for backlight detection.

The micro-ring annular waveguide 2 and the MZI modulator 16 may be provided with a structure to control the free carrier concentration, which implements tuning of the resonant peak of the micro-ring annular waveguide 2 and the intensity modulation of the MZI modulator 16 by the plasma dispersion effect of silicon. A thermal resistor 3 may be arranged around the micro-ring annular waveguide 2 and the MZI modulator 16, which implement tuning of the resonance peak of the micro-ring annular waveguide 2 and tuning of the bias operation point of the MZI modulator 16 by changing the temperature of the micro-ring annular waveguide 2 and the MZI modulator 16, respectively.

Figure 6:
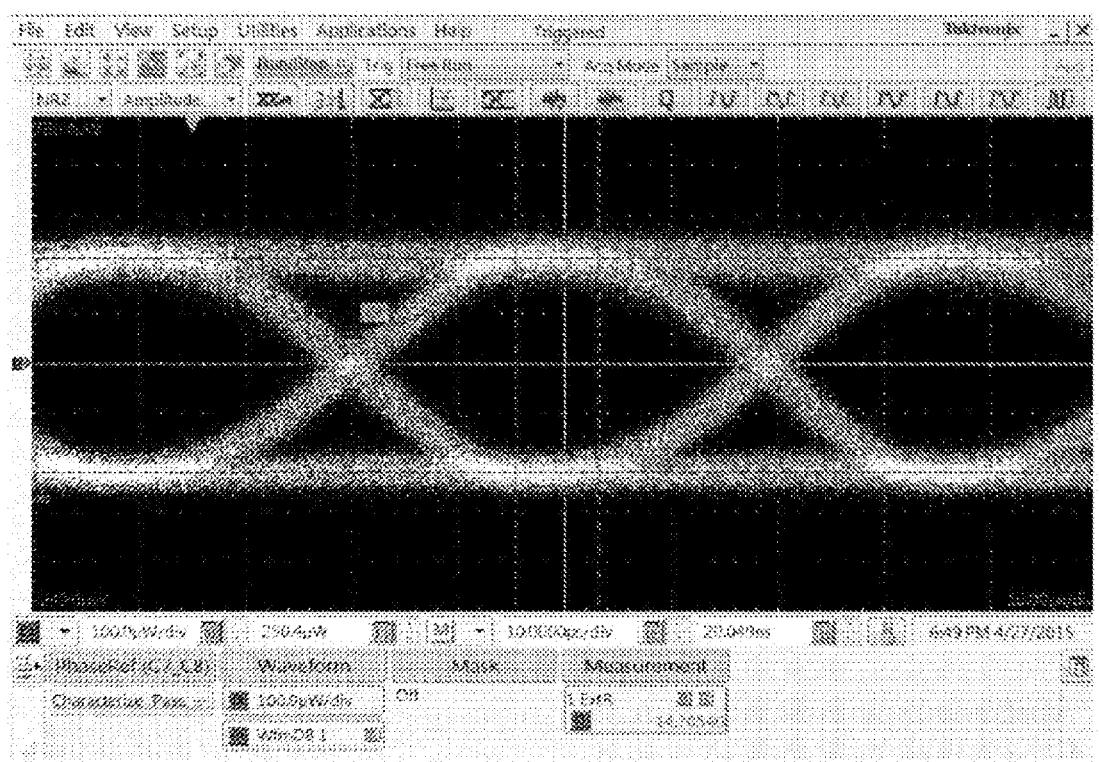
FIG. 6 is an eye diagram measured for an embodiment according to the present invention.

FIG. 6 shows an eye diagram measured for the embodiment of FIG. 5 with a single wavelength rate of 25 Gbit/s. As can be seen, the structure can provide a wavelength-tunable optical signal output with high-speed intensity modulation.

Although the present invention has been illustrated and described in detail by reference to specific embodiments, it will be apparent to those skilled in the art that upon reading and understanding this specification and the drawings thereof, without departing from the spirit and scope of the present invention, various changes may be made in the structure and fabrication details of the coupling alignment device. Such changes will fall within the scope of protection as claimed in the claims of the present invention.

The invention claimed is:

1. A wavelength-tunable external cavity laser comprising a semiconductor optical amplifier chip and a laser external cavity, the laser external cavity comprising a grid filter, a phase adjustor and a silicon-based micro-ring chip, the grid filter and the silicon-based micro-ring chip constituting a wavelength-tunable optical filter which implements wavelength tuning by spectral tuning of the grid filter and/or the silicon-based micro-ring chip, the silicon-based micro-ring chip comprising a first beam-splitting coupler and a micro-ring annular waveguide, the first beam-splitting coupler has a common end coupled to the grid filter and two splitting ports connected to two ports at a side of the micro-ring annular waveguide.

2. The wavelength-tunable external cavity laser of claim 1 wherein the semiconductor optical amplifier chip generates stimulated emission when current is injected, a light extraction end of the semiconductor optical amplifier chip is plated with an AR film and the other end is plated with a HR film, and a gain region of the semiconductor optical amplifier chip is a semiconductor gain amplifier of an inclined straight waveguide or an arc waveguide.

3. The wavelength-tunable external cavity laser of claim 1 wherein the semiconductor optical amplifier chip is a laser die having both ends plated with a reflective film.

4. The wavelength-tunable external cavity laser of claim 1 wherein the grid filter is a fixed grid filter or a tunable grid filter.

5. The wavelength-tunable external cavity laser of claim 1 wherein the silicon-based micro-ring chip and the phase adjustor are coupled by a first lens, and the semiconductor optical amplifier chip and the grid filter are coupled by a second lens.

6. The wavelength-tunable external cavity laser of claim 1 wherein the free spectral range (FSR) of the grid filter is 25 GHz, 50 GHz or other DWDM channel spacing frequency.

7. The wavelength-tunable external cavity laser of claim 1 wherein the phase adjustor is an optical element that changes the optical path by thermal adjustment and/or electric adjustment.

8. The wavelength-tunable external cavity laser of claim 1 wherein the grid filter is a Fabry-Perot grid filter which is a silicon etalon with temperature sensing and a regional heating metal thin-film to form a fixed periodical grid spectrum.

9. The wavelength-tunable external cavity laser of claim 1 wherein the common end of the first beam-splitting coupler is used as a coupling inlet and a resonant light outlet, and each of the two ports of the micro-ring annular waveguide is used as an in end and also a drop end with respect to the other port.

10. The wavelength-tunable external cavity laser of claim 9 wherein the micro-ring annular waveguide is provided with a structure to control the free carrier concentration, which tunes the resonance peak of the micro-ring annular waveguide by the plasma dispersion effect of silicon; and/or, a thermal thin-film resistor is arranged around the micro-ring annular waveguide, which tunes the resonance peak of the micro-ring annular waveguide by changing its temperature.

11. The wavelength-tunable external cavity laser of claim 1 wherein the silicon-based micro-ring chip further comprises a second beam-splitting coupler, and a silicon-based MZI modulator; the generated laser in the external cavity enters the micro-ring annular waveguide from the first beam-splitting coupler and then is output from both through ends of the micro-ring annular waveguide two optical signals, the two optical signals are combined in the second beam-splitting coupler and then enter the MZI modulator, which outputs a modulated optical signal at a back end thereof.

12. The wavelength-tunable external cavity laser of claim 11 wherein the micro-ring annular waveguide and the MZI modulator are provided with a structure to control the free carrier concentration, which implements tuning of the resonant peak of the micro-ring annular waveguide and the intensity modulation of the MZI modulator by the plasma dispersion effect of silicon; and/or, a thermal thin-film resistor is arranged around the micro-ring annular waveguide and the MZI modulator, which implements tuning of the resonance peak of the micro-ring annular waveguide and tuning of the bias operation point of the MZI modulator by changing the temperature of the micro-ring annular waveguide and the MZI modulator, respectively.

13. A wavelength-tunable external cavity laser comprising a semiconductor optical amplifier chip and a laser external cavity, the laser external cavity comprising a grid filter, a phase adjustor and a silicon-based micro-ring chip, the grid filter and the silicon-based micro-ring chip constituting a wavelength-tunable optical filter which implements wavelength tuning by spectral tuning of the grid filter and/or the silicon-based micro-ring chip; wherein the silicon-based micro-ring chip comprises a first beam-splitting coupler, a micro-ring annular waveguide, a second beam-splitting coupler, and a silicon-based MZI modulator; the generated laser in the external cavity enters the micro-ring annular waveguide from the first beam-splitting coupler and then is output from both through ends of the micro-ring annular waveguide two optical signals, the two optical signals are combined in the second beam-splitting coupler and then enter the MZI modulator, which outputs a modulated optical signal at a back end thereof.

* * * * *